United States Patent
Park et al.

(10) Patent No.: US 9,960,086 B2
(45) Date of Patent: May 1, 2018

(54) METHODS, APPARATUS AND SYSTEM FOR SELF-ALIGNED RETROGRADE WELL DOPING FOR FINFET DEVICES

(71) Applicant: GLOBALFOUNDRIES INC., Grand Cayman (KY)

(72) Inventors: Mira Park, Clifton Park, NY (US);
Kwan-Yong Lim, Niskayuna, NY (US);
Steven Bentley, Menands, NY (US);
Amitabh Jain, Malta, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days. days.

(21) Appl. No.: 15/274,974

(22) Filed: Sep. 23, 2016

(65) Prior Publication Data
US 2018/0090391 A1 Mar. 29, 2018

(51) Int. Cl.
| | |
|---|---|
| *H01L 21/31* | (2006.01) |
| *H01L 21/82* | (2006.01) |
| *H01L 21/30* | (2006.01) |
| *H01L 21/8238* | (2006.01) |
| *H01L 21/311* | (2006.01) |
| *H01L 21/3065* | (2006.01) |
| *H01L 21/308* | (2006.01) |
| *H01L 21/223* | (2006.01) |
| *H01L 21/324* | (2006.01) |

(52) U.S. Cl.
CPC .. *H01L 21/823892* (2013.01); *H01L 21/2236* (2013.01); *H01L 21/308* (2013.01); *H01L 21/3065* (2013.01); *H01L 21/31116* (2013.01); *H01L 21/31144* (2013.01); *H01L 21/324* (2013.01); *H01L 21/823821* (2013.01); *H01L 21/823878* (2013.01)

(58) Field of Classification Search
CPC .......... H01L 21/823892; H01L 21/324; H01L 21/31144; H01L 21/31116; H01L 21/823878; H01L 21/3065; H01L 21/823821; H01L 21/2236; H01L 21/308; H01L 21/67063
USPC .......................................................... 438/217
See application file for complete search history.

(56) References Cited

U.S. PATENT DOCUMENTS

2017/0221888 A1* 8/2017 Wu ....................... H01L 27/088

* cited by examiner

*Primary Examiner* — Caleen Sullivan
(74) *Attorney, Agent, or Firm* — Williams Morgan, P.C.

(57) ABSTRACT

At least one method, apparatus and system are disclosed for forming a fin field effect transistor (finFET) having doping region self-aligned with a fin reveal position. A plurality of fins of a transistor is formed. A nitride cap layer on the plurality of fins is formed. An N-type doped region in a first portion of the plurality of fins. A P-type doped region in a second portion of the plurality of fins. A shallow trench isolation (STI) fill process for depositing an STI material on the plurality of fins. A fin reveal process for removing the STI material to a predetermined level. A cap strip process for removing the nitride cap layer for forming a fin reveal position that is self-aligned with the P-type and N-type doped regions.

15 Claims, 11 Drawing Sheets

METHODS, APPARATUS AND SYSTEM FOR SELF-ALIGNED RETROGRADE WELL DOPING FOR FINFET DEVICES

BACKGROUND OF THE INVENTION

Field of the Invention

Generally, the present disclosure relates to the manufacture of sophisticated semiconductor devices, and, more specifically, to various methods for fabricating retrograde wells for finFET devices.

Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a device that typically includes a source region, a drain region, a channel region that is positioned between the source region and the drain region, and a gate electrode positioned above the channel region. Current flow through the FET is controlled by controlling the voltage applied to the gate electrode. If a voltage that is less than the threshold voltage of the device is applied to the gate electrode, then there is no current flow through the device (ignoring undesirable leakage currents, which are relatively small). However, when a voltage that is equal to or greater than the threshold voltage of the device is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the channel from being adversely affected by the electrical potential of the drain. This is sometimes referred to as a so-called short channel effect, wherein the characteristic of the FET as an active switch is degraded.

In contrast to a planar FET, which has a planar structure, there are so-called 3D devices, such as an illustrative FinFET device, which is a 3-dimensional structure. More specifically, in a FinFET, a generally vertically positioned, fin-shaped active area is formed and a gate electrode encloses both of the sides and the upper surface of the fin-shaped active area to form a tri-gate structure so as to use a channel having a 3-dimensional structure instead of a planar structure. In some cases, an insulating cap layer, e.g., silicon nitride, is positioned at the top of the fin and the FinFET device only has a dual-gate structure.

FinFET designs use "fins" that may be formed on the surface of a semiconductor wafer using selective-etching processes. The fins may be used to form a raised channel between the gate and the source and drain of a transistor. The gate is then deposited such that it wraps around the fin to form a trigate structure. Since the channel is extremely thin, the gate would generally have a greater control over the carriers within. However, when the transistor is switched on, the shape of the channel may limit the current flow. Therefore, multiple fins may be used in parallel to provide greater current flow for increased drive strength.

FIG. 1 illustrates a stylized cross-sectional depiction of a state-of-the-art FinFET device. A FinFET device 100 illustrated in FIG. 1 comprises a plurality of "fins" 110. The semiconductor device may be position to a vertical orientation, creating one or more fins 110. The source and drain of the FinFET are placed horizontally along the fin. A high-k metal gate 120 wraps over the fin, covering it on three sides. The gate 120 defines the length of the FinFET device. The current flow occurs along an orthogonal crystal plane in a direction parallel to the plane of the semiconductor wafer. The electrically significant height of the fin (labeled H) is typically determined by the amount of oxide recess in the fin reveal step and hence is constant for all fins 110.

The thickness of the fin (labeled $T_{fi}$) determines the short channel behavior of the transistor device and is usually small in comparison with the height H of the fin 110. The pitch (labeled P) of the fins is determined by lithographic constraints and dictates the wafer area to implement the desired device width. A small value of the pitch P and a large value of the height H enable a better packing of the devices per square area resulting in a denser design, or more efficient use of silicon wafer area.

There is a push to scale down integrated circuits to support ever-shrinking electronic devices. This has prompted designers to reduce the size of finFET devices. As such, the pitch of the fin in finFET devices are reduced. As fins become closer together, leakage currents between fins may become more prevalent. As fin placement become denser, problems with off-state current leakage increase, leading to increased power consumption. To address these problems, designers have implemented retrograde wells, which are dopant wells that are formed between a source fin and a drain fin. In an NMOS device, boron may be implanted into a channel between the source and drain fins. In a PMOS device, phosphorus may be implanted into a channel between the source and drain fins. This channel/well doping increases the resistance of channel/well, resulting in reduced off-state leakage current between the source and drain fins.

Designers have also implemented a deeper type of retrograde well, i.e., the so-called Super-Steep Retrograde Well. A Super-Steep Retrograde Well (SSRW) has a low-high-low channel doping profile which can improve the control of Short-Channel Effect (SCE) without degrading mobility. SSRWs and have been implemented as a vehicle for scaling the channel length and increasing the transistor drive current without increasing the off-state leakage current between source and drain regions. In many cases materials, such as polythiophene (PTS), can become more conducting when dopants are added. PTS may be added to perform self-aligned fin formation. Generally, PTS implant depths are generally uniform when forming SSRW. However, due to process variations, e.g., fin reveal process variations, the location of the PTS may become non-uniform, thereby changing the electrical characteristics of a finFET device.

FIG. 2 shows a stylized depiction of a cross-sectional view of a typical PTS implantation in a finFET device 200. In the manufacturing stage shown, the finFET device 200 includes a substrate 210, such as a silicon substrate or any other appropriate carrier material, on which may be formed an appropriate base layer 220, which may represent an insulating layer, such as a silicon dioxide layer, a silicon nitride layer, a silicon oxynitride layer, and/or the like. For example, the substrate 210 may be comprised of a substantially crystalline semiconductor material, the base layer 220 is provided in the form of an insulating material, and the substrate 210 may define a silicon-on-insulator (SOI) configuration.

Moreover, a plurality of fins 240 are formed on the layer 220. The fins 240 may be formed using silicon material or silicon germanium material (e.g., SiGe III-V). In some embodiments, the fins 240 may be formed such that the spacing between the fins 240 are relatively small, e.g., 50 nm. After further processing known to those skilled in the art, oxide material 230 may be deposited in regions between and immediately around the fins 240.

Further, PTS material 250 may be implanted for doping. Generally, the depths of the PTS implantations are performed in a uniform manner across semiconductor wafers or macro. However, during fin processing, such as fin reveal process, process variations can occur. These process variations may be on a wafer-to-wafer basis, across-wafer basis, or within-macro basis. As shown in FIG. 2, process variations may cause the actual fin height to vary from a fin reveal target 260. Due to such variations, the PTS junction may vary. That is, due to the fin height variations, the relative locations of the PTS doping can vary. In this case, some devices may exhibit undesirable variations in SCE. Also, due to the variations in the PTS junctions, the threshold voltages of the devices may exhibit undesirable variations. These issues may result in production of devices with undesirable SCE and threshold voltage characteristics, leading to performance and manufacturing problems.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus and system for forming a fin field effect transistor (finFET) having doping region self-aligned with a fin reveal position. A plurality of fins of a transistor is formed. A nitride cap layer on the plurality of fins is formed. An N-type doped region in a first portion of the plurality of fins. A P-type doped region in a second portion of the plurality of fins. A shallow trench isolation (STI) fill process for depositing an STI material on the plurality of fins. A fin reveal process for removing the STI material to a predetermined level. A cap strip process for removing the nitride cap layer for forming a fin reveal position that is self-aligned with the P-type and N-type doped regions.

BRIEF DESCRIPTION OF THE DRAWINGS

The disclosure may be understood by reference to the following description taken in conjunction with the accompanying drawings, in which like reference numerals identify like elements, and in which.

Figure 1:
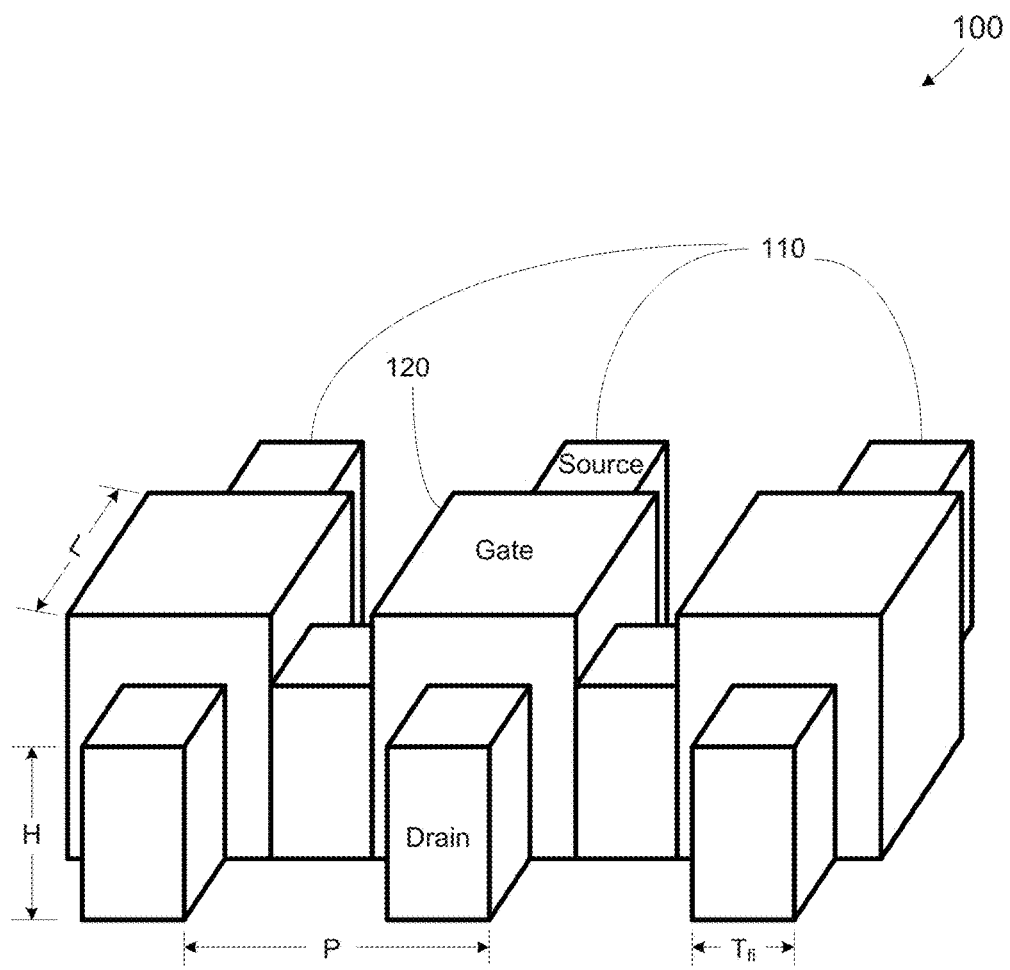
FIG. 1 illustrates a stylized cross-sectional depiction of a state-of-the-art FinFET device with PTS doping.
Figure 2:
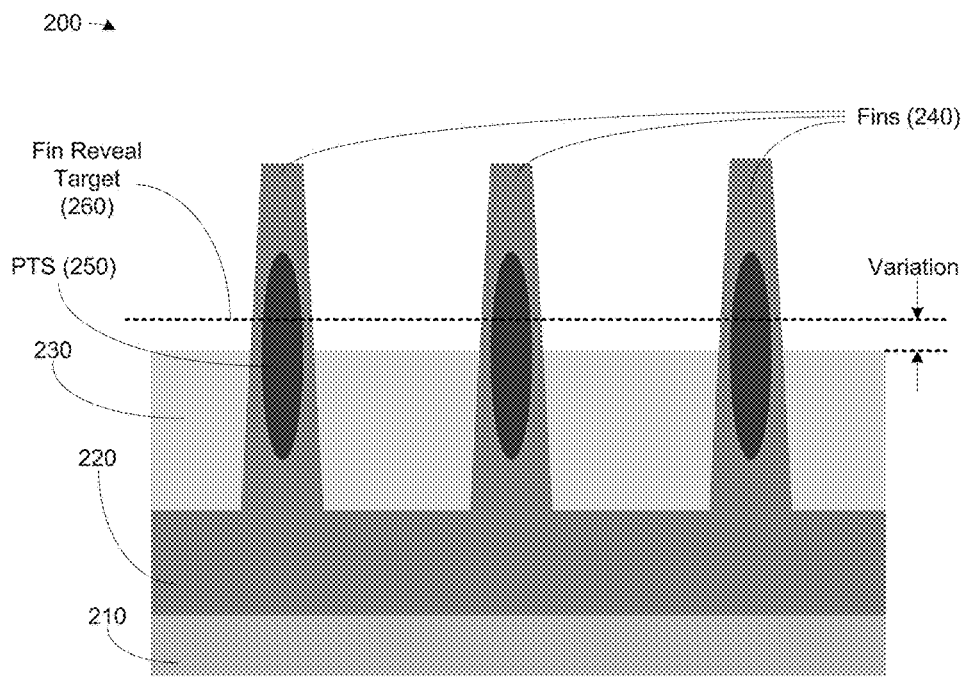
FIG. 2 illustrates a stylized depiction of a cross-sectional view of a typical PTS implantation in a finFET device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for forming fins of finFET devices such that the oxide boundaries and the doping boundaries of the devices are relatively consistent with each other. This may provide for the threshold voltages of the devices to be substantially consistent. Embodiments herein provide for forming doping levels in retrograde wells (e.g., super-steep retrograde wells) that are substantially uniform across various fins and/or finFET devices. In some embodiments, polythiophene (PTS) material may be deposited to perform self-aligned fin formation. Embodiments herein provide for forming PTS/doping regions in retrograde wells that are substantially consistent across various fins and finFET devices. Therefore, embodiments herein provide for self-aligned PTS-fin processing for retrograde wells, e.g., super-steep retrograde wells (SSRW). Accordingly, embodiments herein provide for a self-aligned PTS junction finFET.

Figure 3:
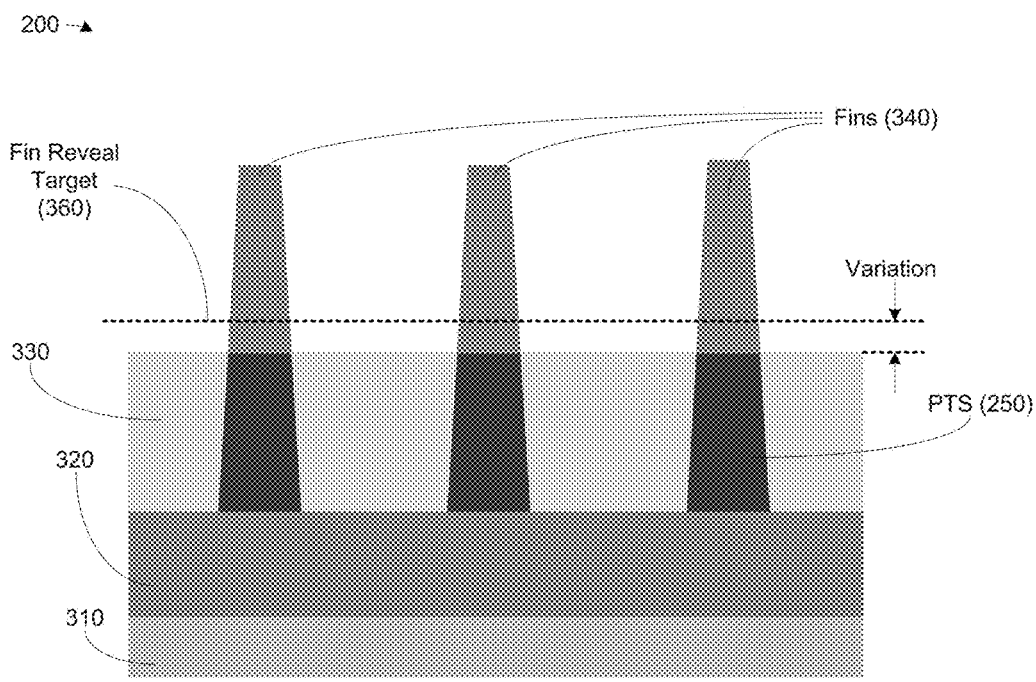
FIG. 3 illustrates a stylized depiction of a cross-sectional view of a finFET device having a PTS region, in accordance with some embodiments herein.

FIG. 3 illustrates a stylized depiction of a cross-sectional view of a finFET device having a PTS region, in accordance with some embodiments herein. Those skilled in art having benefit of the present disclosure would appreciate that the several process steps are performed to form a device in the manufacturing stage shown in FIG. 3.

In the manufacturing stage shown in FIG. 3, the finFET device 300 includes a substrate 310, such as a silicon substrate or any other appropriate carrier material, on which may be formed an appropriate base layer 320, which may represent an insulating layer, such as a silicon dioxide layer, a silicon nitride layer, a silicon oxynitride layer, and/or the like. For example, the substrate 310 may be comprised of a substantially crystalline semiconductor material, the base layer 320 may be an insulating material, and the substrate 310 may define a silicon-on-insulator (SOI) configuration.

Moreover, a plurality of fins 340 are formed on the layer 320. The fins 340 may be formed using silicon material or silicon germanium material (e.g., SiGe III-V). In some embodiments, the fins 340 may be formed such that the spacing between the fins 340 are relatively small, e.g., 50 nm. After further processing known to those skilled in the art, oxide material 330 may be deposited in regions between and immediately around the fins 340.

In one embodiment, a material, such as polythiophene (PTS) 350, which can become more conducting when dopants are added. In one embodiment, PTS formations 350 may be added to perform self-aligned fin formation. The depth of the PTS implantation is implemented in a substantially uniform manner. Embodiments herein provide for an PTS implant depth that are generally uniform when forming retrograde wells, e.g., SSRW, despite any process variations, e.g., fin reveal process variations. The PTS junction is a self-aligned junction. Due to process variations, the device 300 may exhibit an off-fin reveal feature 360, which in some cases may be approximately 1 nm. Despite the fin reveal variation 360, the PTS junction may remain consistent in integrated circuits that are in accordance with embodiments herein. Accordingly, the locations of the PTS formations 350 may be substantially uniform, providing for the electrical characteristics of finFET devices to be substantially consistent. Therefore, embodiments herein may provide various advantages, such as improved SCE control in spite of fin reveal variation 360, reduced implant damage, and/or substantial lack of doing at active fin regions, which may result in improved electron/hole mobility, leading to enhanced device performance.

Figure 4:
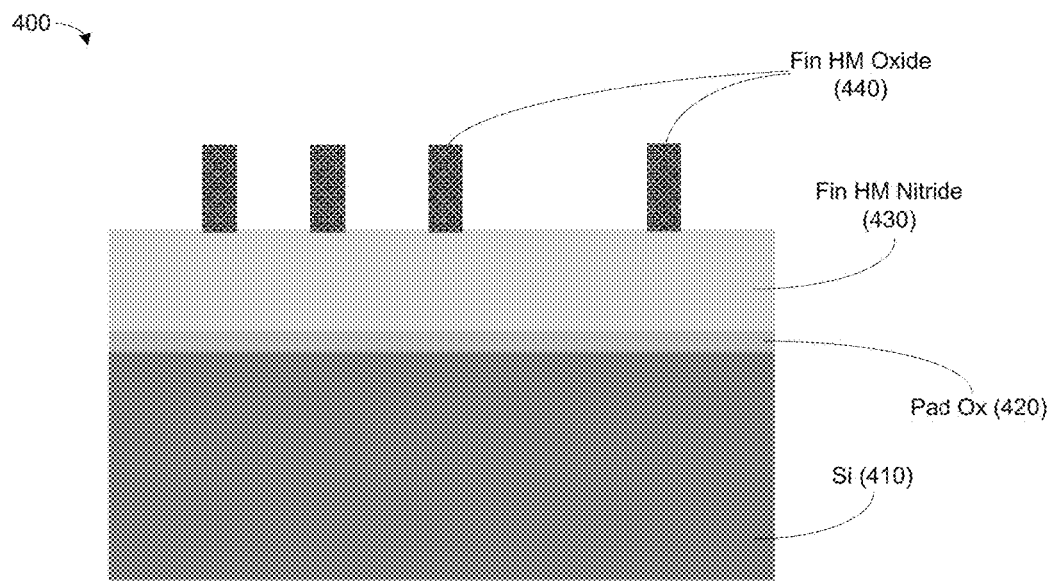
FIGS. 4-19 illustrate stylized cross-sectional depictions of various process steps performed on a finFET device, in accordance with embodiments herein.

FIGS. 4-19 illustrate stylized cross-sectional depictions of various process steps performed on a finFET device, in accordance with embodiments herein. Referring to FIG. 4, an substrate layer 410, e.g., silicon substrate, may be formed. A base layer 420, such as pad oxide layer, may be formed above the substrate layer 410. A fin hard mask layer 430 may be formed above the base layer 420. In one embodiment, the hard mask structure may be comprised of silicon nitride (SiN). A plurality of fin hard mask oxide structures 440 may be formed above the fin hard mask layer 430.

Figure 5:
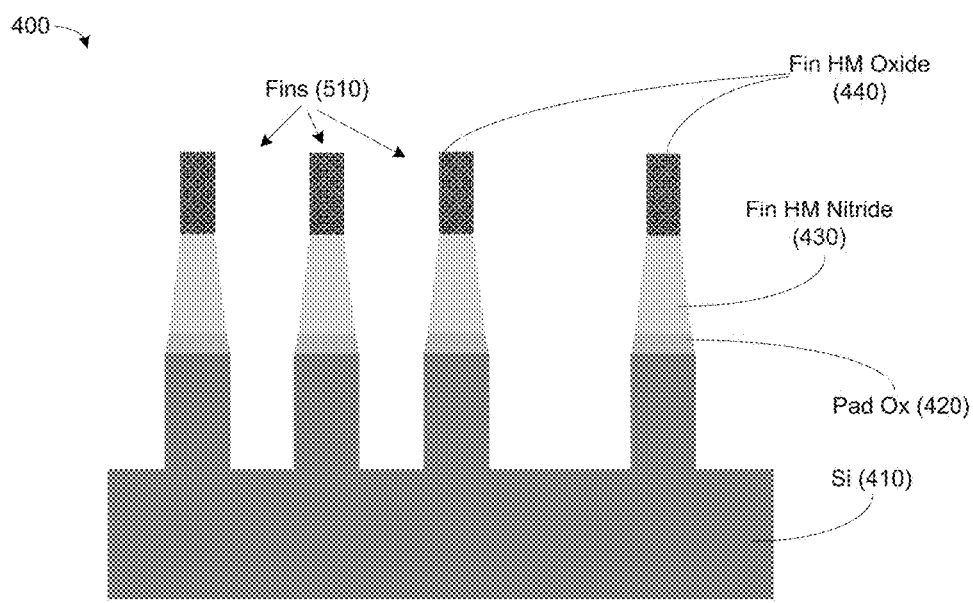

A partial fin etching process may be performed, revealing a plurality of multi-layered fins 510, as shown in FIG. 5.

This process may be performed using a reactive-ion etching (RIE) process. This process removes portions of the substrate layer 410, the base layer 420, and the fin hard mask layer 430, revealing a more defined shape of the fins 510.

Figure 6:
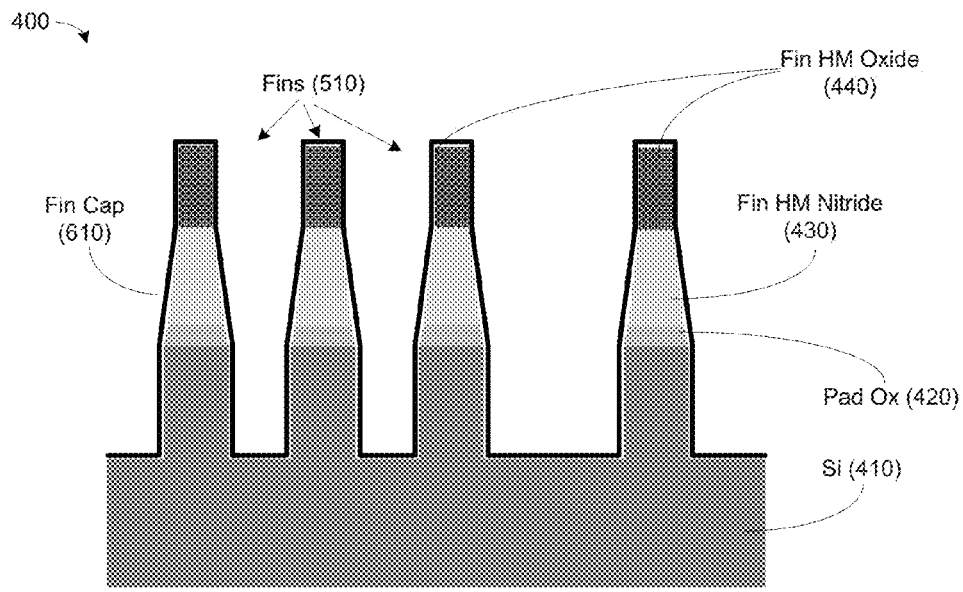

Subsequently, as shown in FIG. 6, a thin liner, i.e., fin cap 610 is deposited on the device 300. The thin liner 610 encapsulates the fins 510 and portions of the substrate layer 410. In one embodiment, the thin liner 610 may be comprised of silicon nitride (SiN). The thin liner 610 may be sufficiently thick to prevent or reduce fin oxidization and provide fin CD protection, yet thin enough to allow for filling of the space between the fins 510 with an insulation material, such as F-OX. In one embodiment, the thin liner 610 may be less than about 3 nm.

Figure 7:
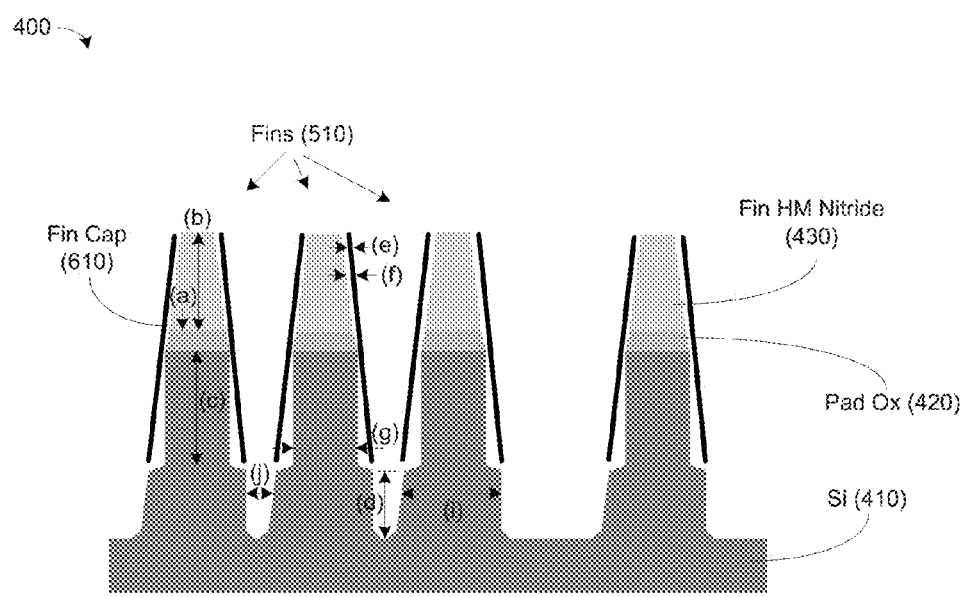

Subsequently, a full fin RIE process may be performed, further revealing the fins 510 in the substrate region 410, as shown in FIG. 7. In one embodiment, this process may include performing a fin nitride RIE process, and oxide RIE process, and a silicon RIE process. In one embodiment, the pad oxide portion (a) of the fin may be between about 2 nm to about 4 nm, e.g., about 3 nm. The fin hard mask SiN region (b) may be between about 15 nm to about 30 nm, e.g., about 20 nm. The active fin region (c) may be between about 35 nm to about 50 nm, e.g., about 42 nm.

The local shallow trench isolation (STI) (d) may be between about 40 nm to about 70 nm, e.g., about 50 nm. The cap SiN liner (e) may be between about 2 nm to about 6 nm, e.g., about 4 nm. The cap oxide liner (0 may be between about 1 nm to about 3 nm, e.g., about 2 nm. The active fin top CD (g) may be between about 8 nm to about 12 nm, e.g., about 10 nm. The active fin bottom CD (h) may be between about 10 nm to about 15 nm, e.g., about 12 nm. The sub-fin top CD (i) may be between about 18 nm to about 28 nm, e.g., about 24 nm. The sub-fin space (j) may be between about 6 nm to about 12 nm, e.g., about 8 nm. Those skilled in the art would appreciate that other dimensions for the features (a) through (j) may be implemented while remaining within the spirit and scope of the embodiments and some of the claims herein.

Figure 8:
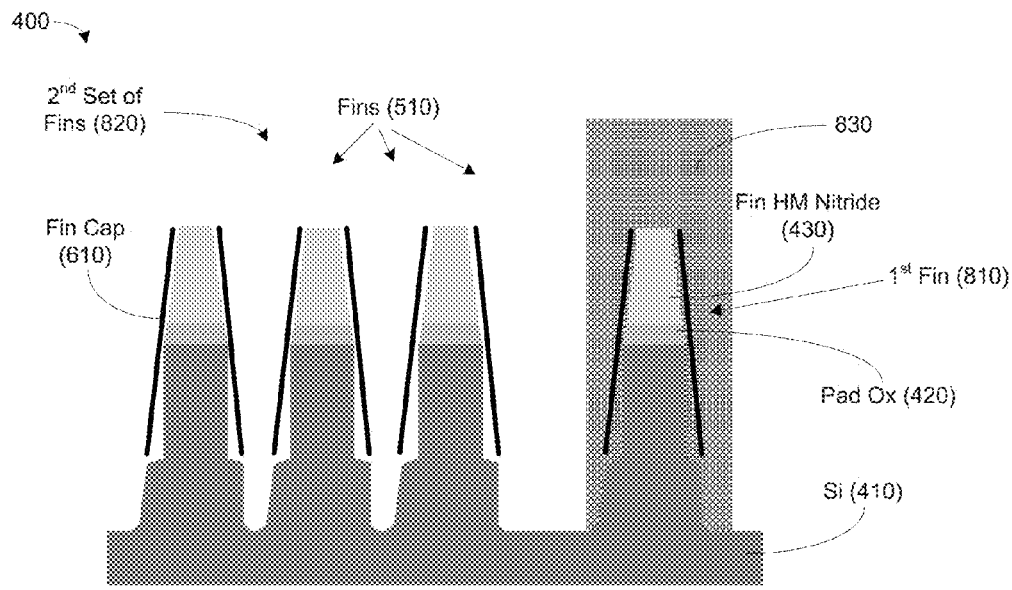

Turning now to FIG. 8, in one embodiment, a photoresist material 830 may be deposited on a first fin 810 for performing PW patterning. In other embodiments, the material 830 may be other types of photo-resistant materials, such as a spin on hard mask (SOH) layer. A second set of fins 820 are shielded from the application of the material 830.

Figure 9:
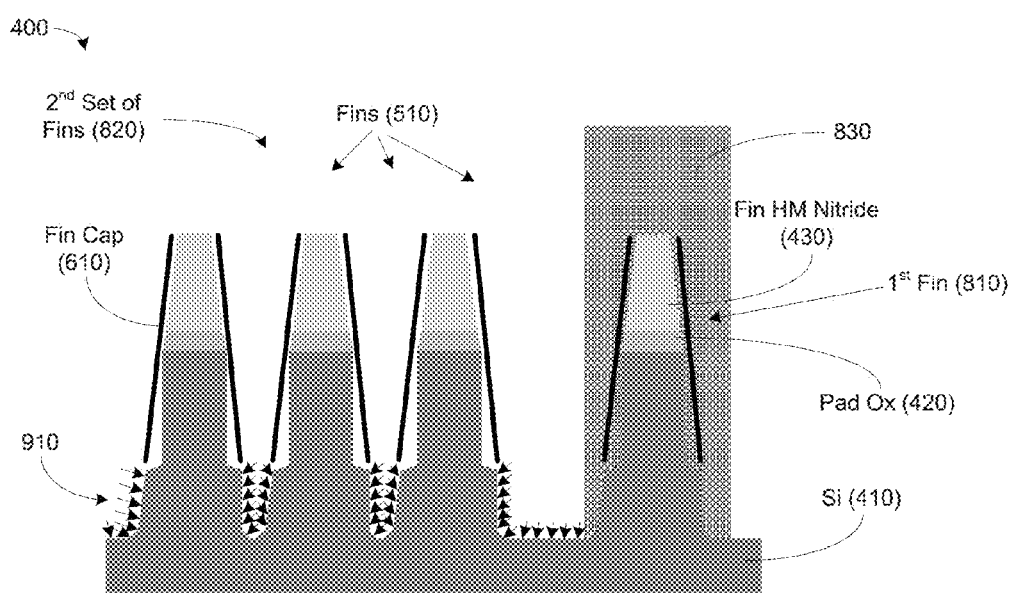

Subsequently, a P-type plasma doping process may be performed, to implement doping material 910 into the regions not protected by the photoresist material 830, as shown in FIG. 9. Further, the doping material is not implemented into the linear region, i.e., the region comprising the cap liner 610. The arrows in FIG. 9 indicate the implementation of the doping material 910. In one embodiment, the doping material 910 may be boron.

Figure 10:
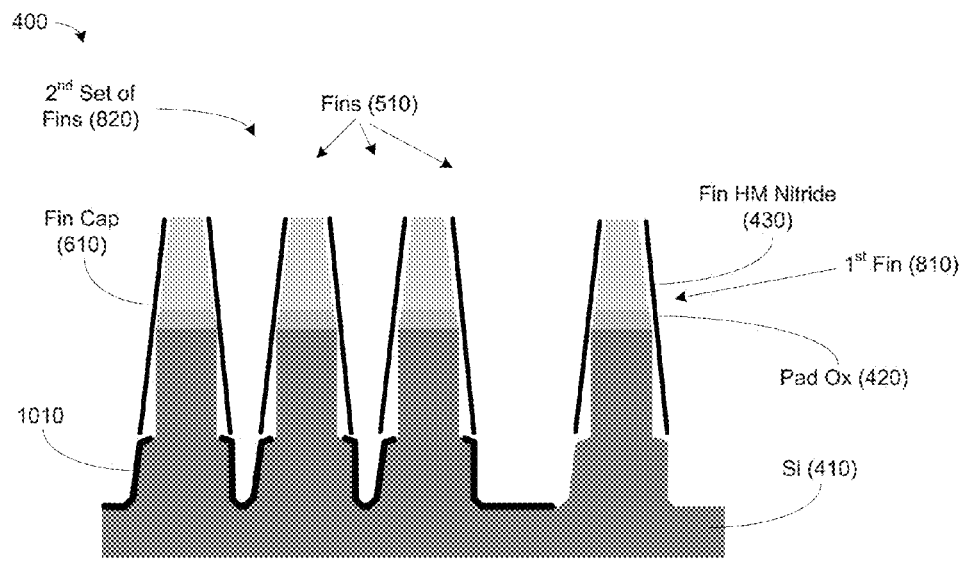

As shown in FIG. 10, a PW mask strip may be performed, stripping the material 830. In this manner, the silicon regions that were not protected by the photoresist material 830 are exposed. Further, the regions exposed to the P-type plasma doping process provide a P-type doping region 1010.

Figure 11:
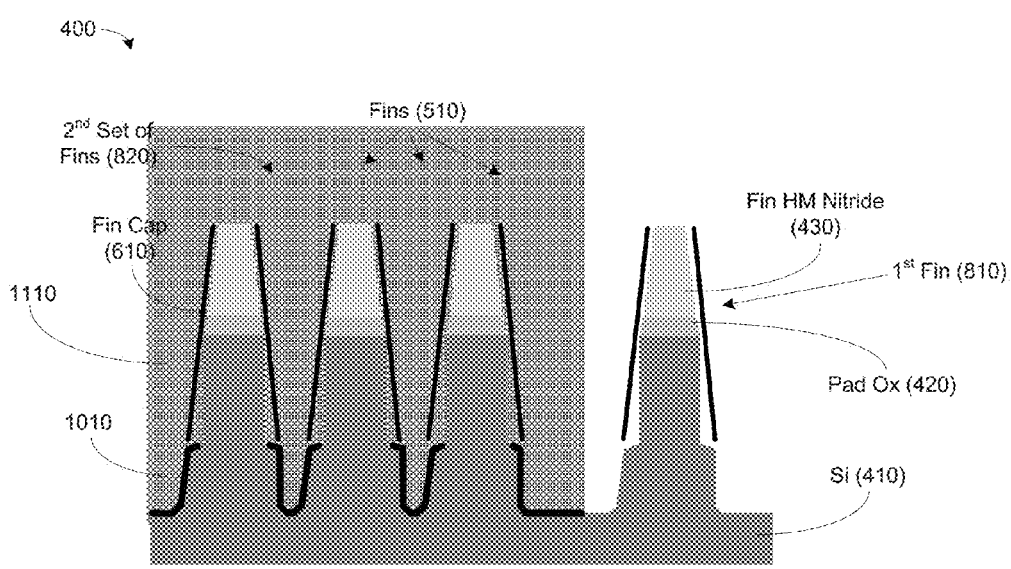

Subsequently, a photoresist material 1110 may be deposited on the second set fin 820 for performing an NW patterning, as shown in FIG. 11. In other embodiments, the material 1010 may be other types of photo-resistant materials, such as a spin on hard mask (SOH) layer. The first fin 810 and the immediately surrounding region are shielded from the application of the material 830.

Figure 12:
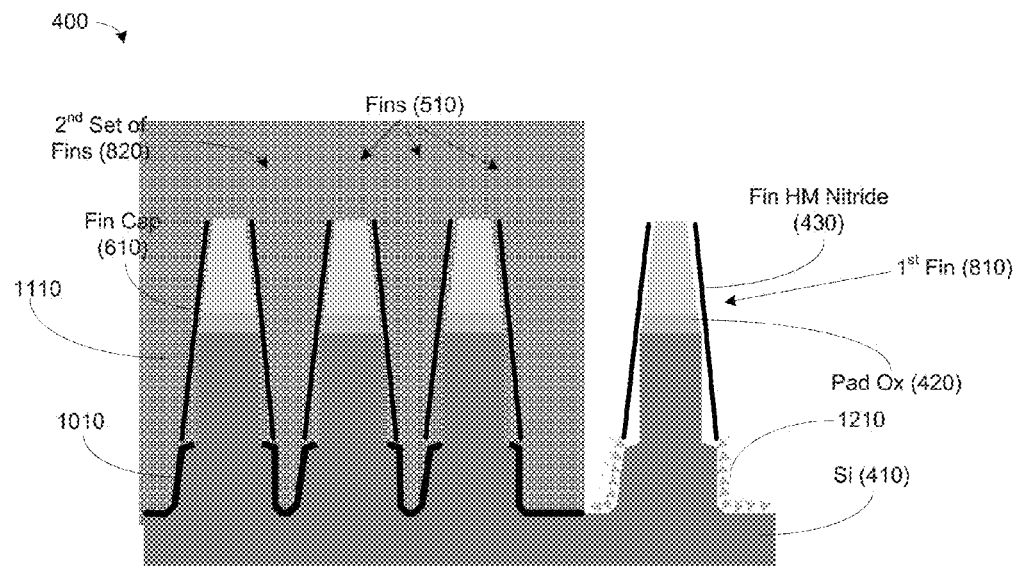

An N-type plasma doping process may then be performed, to implement doping material 910 into the regions not protected by the photoresist material 830, as shown in FIG. 12. Further, the N-type doping material is not implemented into the linear region, i.e., the region comprising the cap liner 610. The arrows in FIG. 12 indicate the implementation of the doping material 1110. In one embodiment, the doping material 1110 may be phosphorus or arsenic materials.

Figure 13:
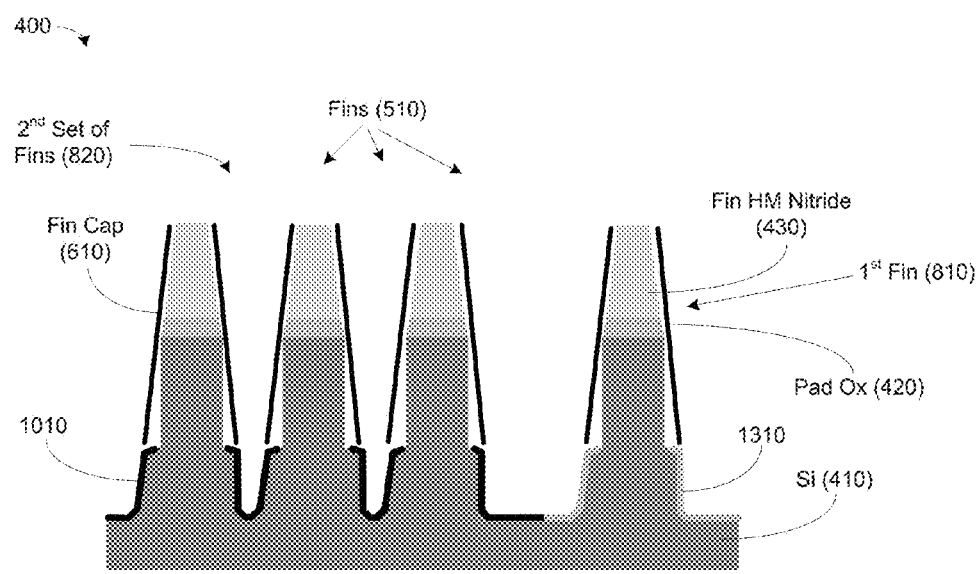

As shown in FIG. 13, an NW mask strip may be performed, stripping the material 1110. In this manner, the silicon region that was not protected by the photoresist material 1110 is exposed. Further, the regions exposed to the N-type plasma doping process provide an N-type doping region 1310.

Figure 14:
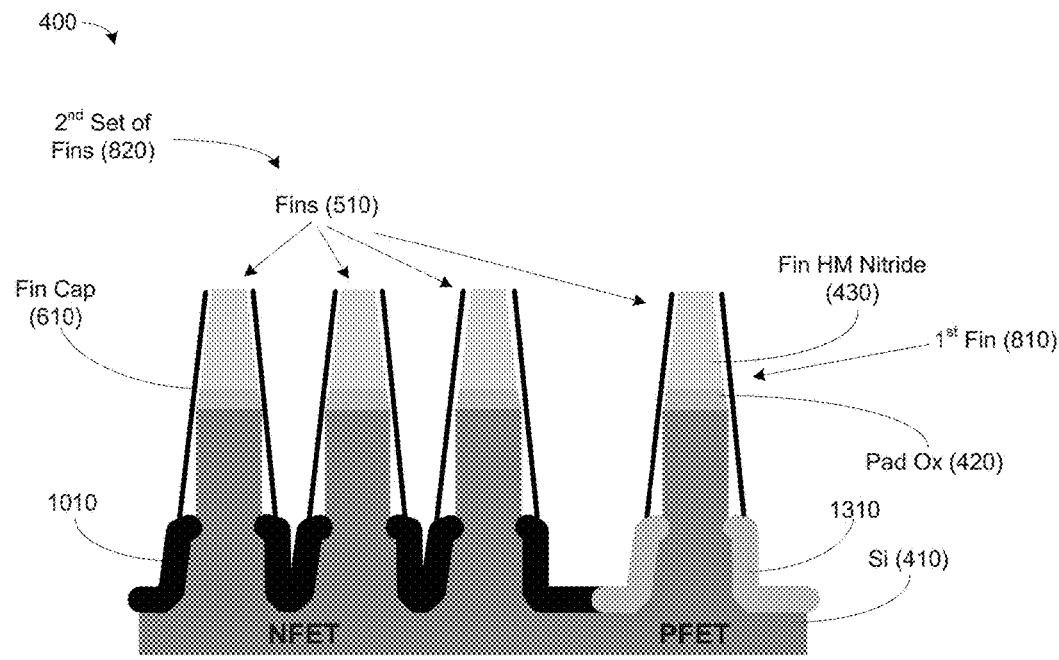

Subsequently, a dopant activation anneal process is performed, as shown in FIG. 14. As a result of the dopant activation anneal process, diffusion of the P-type and N-type dopant into the fins 510 occurs. In the P-type dopant region, the P-type material (e.g., boron) diffuses into the silicon region of the second set of fins 820. In the N-type dopant region, the N-type material (e.g., phosphorus or arsenic materials) diffuses into the silicon region of the first fin 810. The amount of diffusion of the P-type and N-type materials depends on the width of the fins 510. For fins of small widths, the diffusion occurs in a greater percentage of the total fin width, and vice versa.

Figure 15:
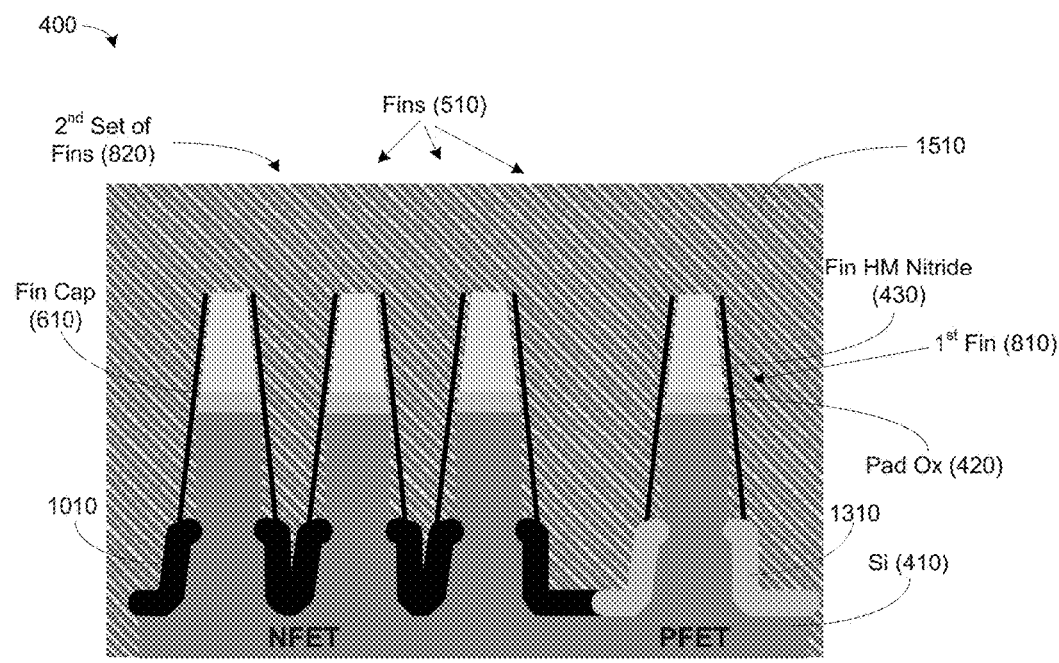
Figure 16:
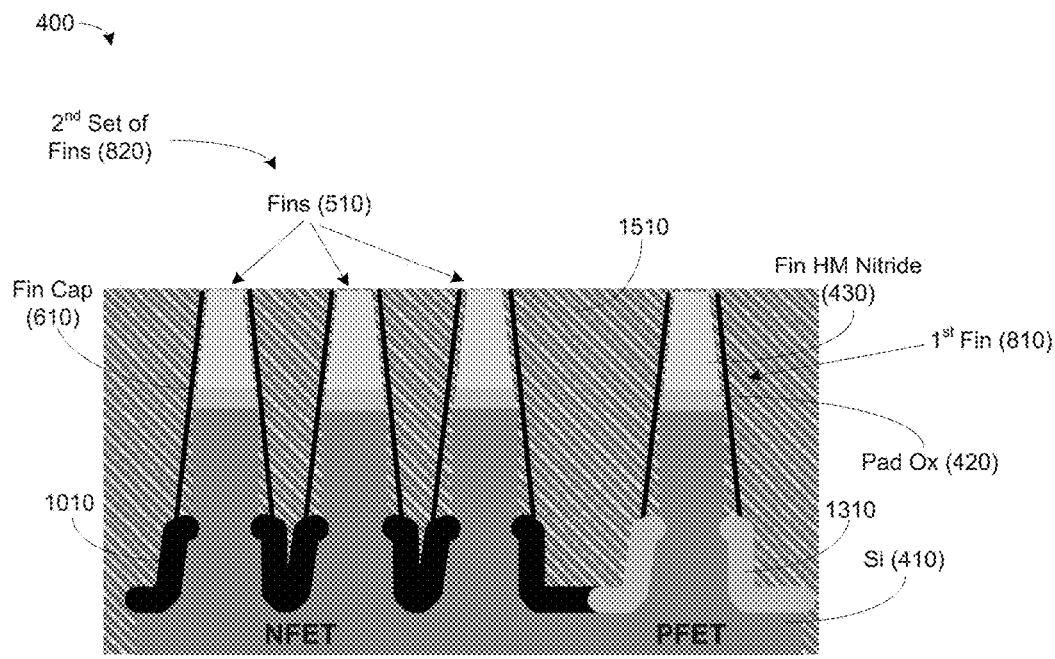
Figure 17:
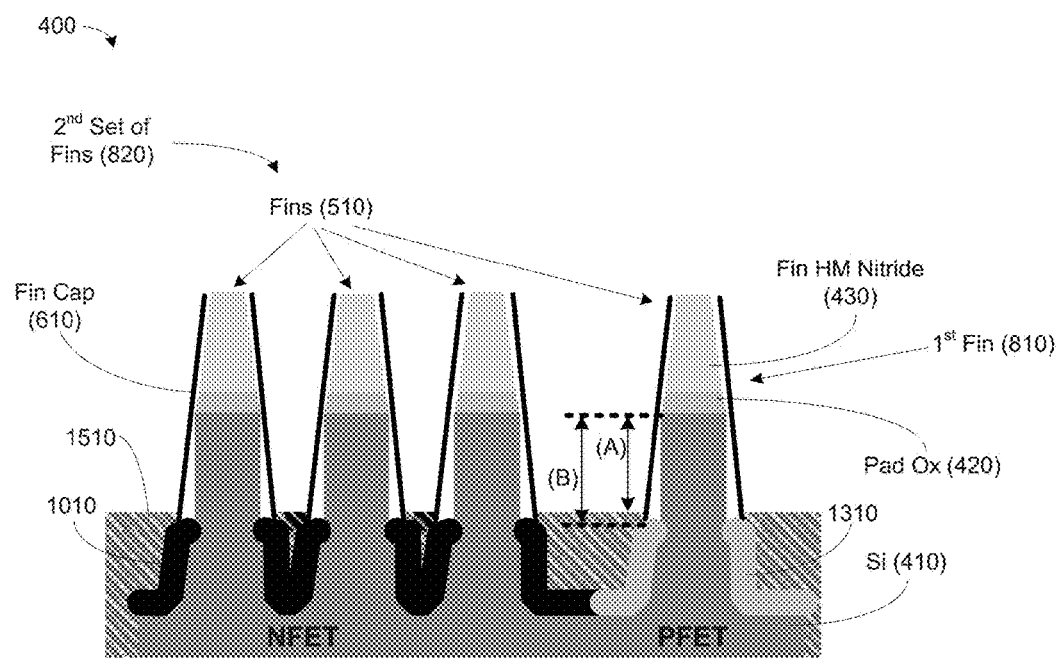

As shown in FIG. 15, a STI fill process is performed. An STI material 1510, such as oxide, flow oxide, etc., may be deposited about the entirety of the device 300. Subsequently, a chemical-mechanical polishing (CMP) process may be performed, as shown in FIG. 16. The STI CMP process is performed to polish down the STI material 1510 to the level of the height of the fins 510.

A fin reveal process is performed, as shown in FIG. 16. This process is a fin reveal process that removes a predetermined amount if STI material 1510, above the P-type region 1010 (i.e., NFET region) and the N-type region 1310 (i.e., PFET region). Further, the STI material 1510 is removed to a height such that self-aligned PTS junction formation is made possible. As such, the STI material 1510 is removed to a height such that the height of the active fin portion (A) above the STI material 1510 is less than the total height of the active fin portion (B). Self-aligned junction formation is made possible when the height of the active fin portion (A) above the STI material 1510, is less than the total height of the active fin portion (B). In some embodiments, the difference in the height between the height of the active fin portion (A) above the STI material 1510 and the total height of the active fin portion (B) is in the range of about 4 nm to about 5 nm.

Figure 18:
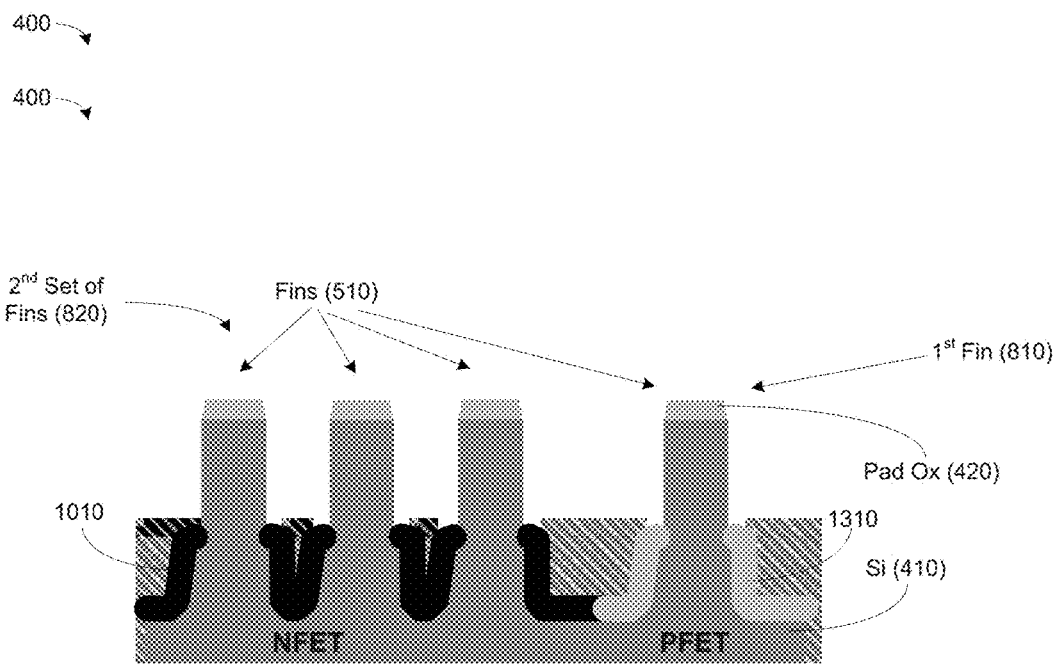

As shown in FIG. 18, a fin hard mask strip process and a fin cap strip process are performed. The fin hard mask 410 is removed by the fin hard mask strip process. The fin cap layer 610 is removed by the fin cap strip process, exposing the base layer 420. Those skilled in the art having benefit of the present disclosure would appreciate that a trench would be formed if excessive recess of the fins 510 were performed.

Figure 19:
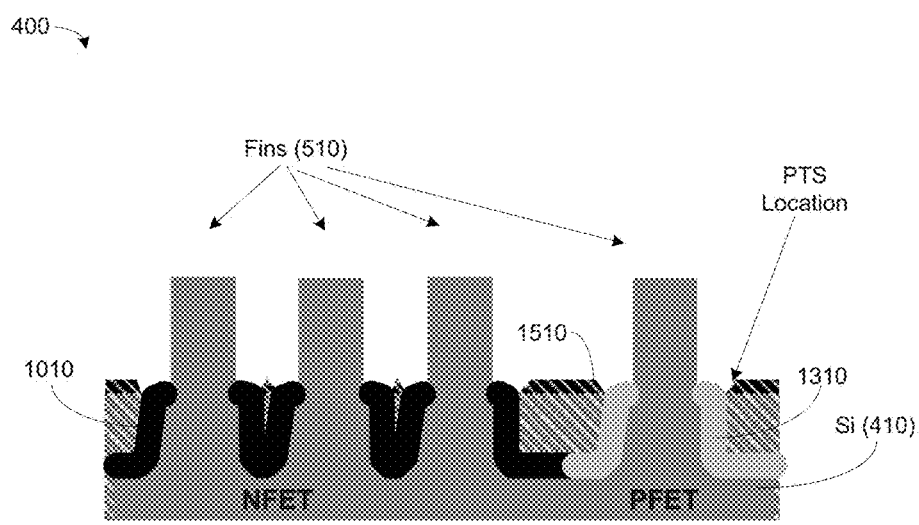

Subsequently, a fin cap oxide strip process is performed, as shown in FIG. 19. The fin cap oxide strip process removes the base layers 420 on the fins 510. This process also causes the fin reveal position to be self-aligned with the PTS location, as shown in FIG. 19. The remaining portions of the STI layer 1510 are substantially smooth due to the isotropic etching behavior. Based upon this fin cap oxide strip process, the oxide boundary and the doping boundary matches substantially exactly.

Further, processing steps known to those skilled in the art having benefit of the present disclosure are performed. For example, further oxide deposition process, silicon deposition process for gate deposition, etc., may be performed to complete processing of the device 400 for forming an integrated circuit finFET device.

In this manner, doping levels in retrograde wells, e.g., SSRW would be substantially uniform across the plurality of fins 510. Therefore, PTS regions in retrograde wells of the device 400 would be substantially consistent across various fins and finFET devices. Accordingly, embodiments herein provide for self-aligned PTS-fin processing for retrograde wells, e.g., SSRW. Thus, embodiments herein provide for a self-aligned PTS junction finFET. Embodiments herein may be implemented in processes involving 10 nm or smaller semiconductor technology.

Figure 20:
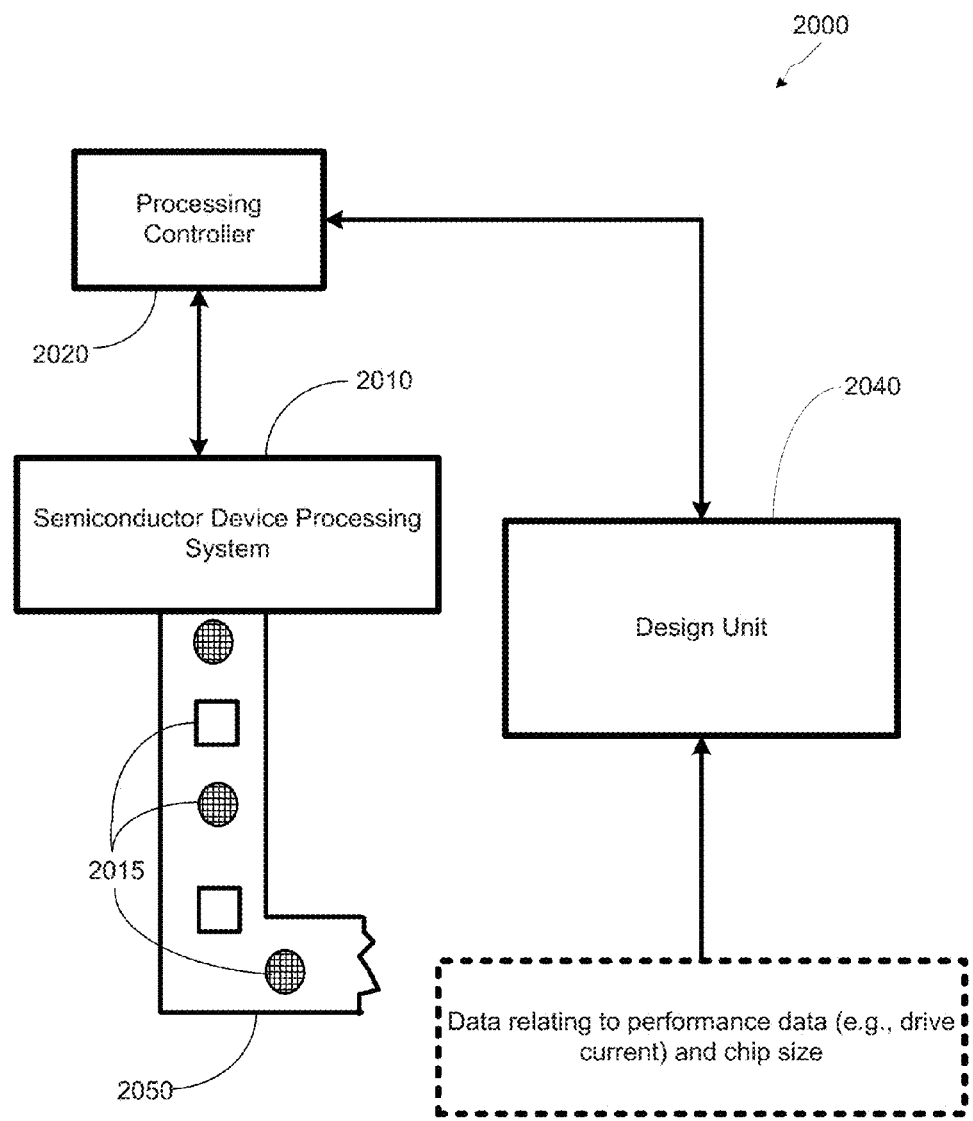
FIG. 20 illustrates a stylized depiction of a system for fabricating a semiconductor device package comprising finFET devices, in accordance with embodiments herein.

Turning now to FIG. 20, a stylized depiction of a system for fabricating a semiconductor device package comprising a topside interconnection substrate, in accordance with embodiments herein, is illustrated. The system 2000 of FIG. 20 may comprise a semiconductor device processing system 2010 and a design unit 2040. The semiconductor device processing system 2010 may manufacture integrated circuit devices based upon one or more designs provided by the design unit 2040.

The semiconductor device processing system 2010 may comprise various processing stations, such as etch process stations, photolithography process stations, CMP process stations, etc. One or more of the processing steps performed by the processing system 2010 may be controlled by the processing controller 2020. The processing controller 2020 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 2010 may produce integrated circuits on a medium, such as silicon wafers. More particularly, the semiconductor device processing system 2010 produce integrated circuits having finFET devices that comprise PTS regions in retrograde wells of the device 400 that are substantially consistent across various fins and finFET devices. Accordingly, the system 2000 is capable for manufacturing finFET devices that comprise self-aligned PTS-fin processing for retrograde wells, e.g., SSRW.

The production of integrated circuits by the device processing system 2010 may be based upon the circuit designs provided by the integrated circuits design unit 2040. The processing system 2010 may provide processed integrated circuits/devices 2015 on a transport mechanism 2050, such as a conveyor system. In some embodiments, the conveyor system may be sophisticated clean room transport systems that are capable of transporting semiconductor wafers. In one embodiment, the semiconductor device processing system 2010 may comprise a plurality of processing steps, e.g., the $1^{st}$ process step, the $2^{nd}$ process set, etc., as described above.

In some embodiments, the items labeled "2015" may represent individual wafers, and in other embodiments, the items 2015 may represent a group of semiconductor wafers, e.g., a "lot" of semiconductor wafers. The integrated circuit or device 2015 may be a transistor, a capacitor, a resistor, a memory cell, a processor, and/or the like.

The integrated circuit design unit 2040 of the system 2000 is capable of providing a circuit design that may be manufactured by the semiconductor processing system 2010. The integrated circuit design unit 2040 may be capable of determining the number of devices (e.g., processors, memory devices, etc.) to place in a device package. The integrated circuit design unit 2040 may also determine the height of the fins, the size of the fin channels, self-aligned PTS-fins, etc. These dimensions may be based upon data relating to drive currents/performance metrics, device dimensions, etc. Based upon such details of the devices, the integrated circuit design unit 2040 may determine specifications of the finFETs that are to be manufactured. Based upon these specifications, the integrated circuit design unit 2040 may provide data for manufacturing a semiconductor device package described herein.

The system 2000 may be capable of performing analysis and manufacturing of various products involving various technologies. For example, the system 2000 may design and production data for manufacturing devices of CMOS technology, Flash technology, BiCMOS technology, power devices, memory devices (e.g., DRAM devices), NAND memory devices, and/or various other semiconductor technologies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a plurality of fins of a transistor;
    forming a nitride cap layer on said plurality of fins;
    forming an N-type doped region in a first portion of said plurality of fins;
    forming a P-type doped region in a second portion of said plurality of fins;
    performing a shallow trench isolation (STI) fill process for depositing an STI material on said plurality of fins;
    performing a fin reveal process for removing said STI material to a predetermined level; and
    performing a cap strip process for removing said nitride cap layer for forming a fin reveal position that is self-aligned with said P-type and N-type doped regions.

2. The method of claim 1, wherein forming said plurality of fins of a transistor comprises:
    forming a silicon layer;
    forming a nitride layer over said silicon layer;
    forming a fin hard mask nitride layer over said nitride layer;
    forming a plurality of fin hard mask oxide features over said fin hard mask nitride layer; and
    performing a partial fin etch process.

3. The method of claim 2, further comprising:
    performing a fin nitride reactive ion (ME) etching process for removing horizontal portions of said nitride cap;
    performing an oxide ME process for removing said fin hard mask oxide features; and
    performing a silicon ME process for removing a portion of said silicon layer below vertical portions of said nitride cap layer.

4. The method of claim 1, wherein forming said nitride cap layer on said plurality of fins comprises forming said nitride cap over said plurality of fins and said silicon layer.

5. The method of claim 1, wherein forming said P-type doped region in a second portion of said plurality of fins comprises
    forming a first photoresist layer over said first portion of said plurality of fins;
    performing a P-type plasma doping region on said plurality of fins;
    performing a PW mask strip to remove said first photoresist layer; and
    performing a dopant activation anneal process.

6. The method of claim 5, wherein forming said N-type doped region in a first portion of said plurality of fins comprises
    forming a second photoresist layer over said first portion of said plurality of fins;
    performing an N-type plasma doping region on said plurality of fins;
    performing a NW mask strip to remove said second photoresist layer; and
    performing said dopant activation anneal process.

7. The method of claim 6, wherein:
    performing said N-type plasma doping region comprises using at least one of a phosphorus material and arsenic material; and
    performing said P-type plasma doping region comprises using a boron material.

8. The method of claim 1, wherein forming said fin reveal position that is self-aligned with said P-type and N-type doped regions comprises forming said plurality of fins that are self-aligned with a doped retrograde well.

9. The method of claim 8, wherein forming said plurality of fins that are self-aligned with a doped retrograde well comprises forming said plurality of fins that are self-aligned with a super steep doped retrograde well (SSRW).

10. The method of claim 1, wherein performing a fin reveal process comprises:
    removing said STI material such that the length of the active area of the fins in said first portion of said plurality of fins relative to the N-type doping region is greater than the length of the active are of said fins in the first portion of said plurality of fins relative to said predetermined level; and
    removing said STI material such that the length of the active area of the fins in said second portion of said plurality of fins relative to the P-type doping region is greater than the length of the active are of said fins in the second portion of said plurality of fins relative to said predetermined level.

11. A method, comprising:
    forming a plurality of fins of a transistor;
    forming an N-type doped region in a first portion of said plurality of fins for forming a PFET region;
    forming a P-type doped region in a second portion of said plurality of fins for forming an NFET region; and
    forming an STI region that is self-aligned with said N-type and said P-type doped regions, wherein said STI region is a super steep retrograde well.

12. The method of claim 11, wherein forming said plurality of fins of a transistor comprises:
    forming a silicon layer;
    forming a nitride layer over said silicon layer;
    forming a fin hard mask nitride layer over said nitride layer;

forming a plurality of fin hard mask oxide features over said fin hard mask nitride layer;
forming a nitride cap layer on said plurality of fins and said silicon layer;
performing a partial fin etch process;
performing a fin nitride reactive ion (ME) etching process for removing horizontal portions of said nitride cap;
performing an oxide ME process for removing said fin hard mask oxide features; and
performing a silicon ME process for removing a portion of said silicon layer below vertical portions of said nitride cap layer;
performing a shallow trench isolation (STI) fill process for depositing an STI material on said plurality of fins; and
performing a fin reveal process for removing said STI material to a predetermined level.

13. The method of claim 12, wherein forming said fin reveal position that is self-aligned with said P-type and N-type doped regions comprises forming said plurality of fins that are self-aligned with a doped retrograde region.

14. The method of claim 11, wherein forming said P-type doped region in a second portion of said plurality of fins comprises
    forming a first photoresist layer over said first portion of said plurality of fins;
    performing a P-type plasma doping region on said plurality of fins;
    performing a PW mask strip to remove said first photoresist layer; and
    performing a dopant activation anneal process.

15. The method of claim 14, wherein forming said N-type doped region in a first portion of said plurality of fins comprises
    forming a second photoresist layer over said first portion of said plurality of fins;
    performing an N-type plasma doping region on said plurality of fins;
    performing a NW mask strip to remove said second photoresist layer; and
    performing said dopant activation anneal process.

* * * * *